Figure 1:
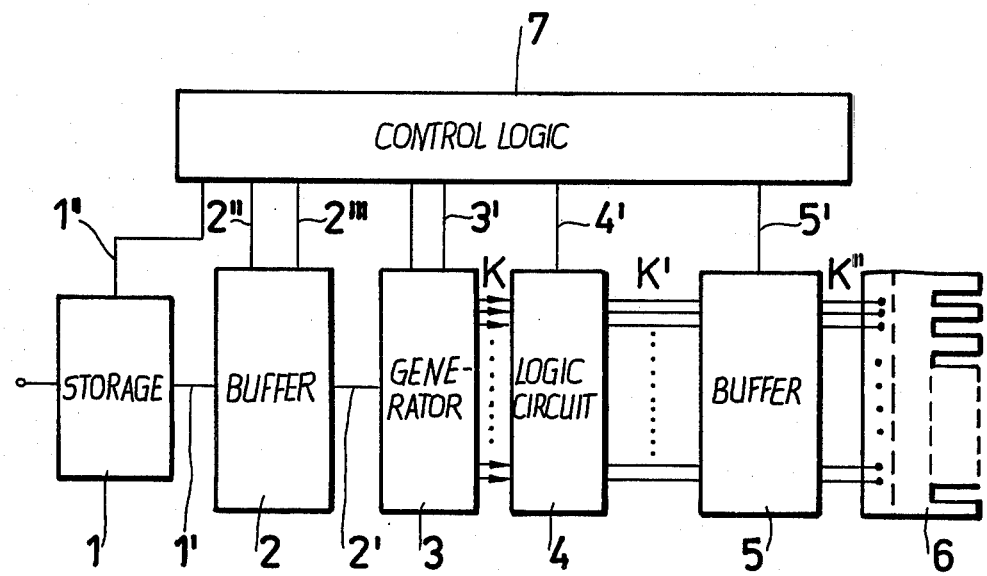

United States Patent [19]

Eichhorn et al.

[11] Patent Number: 4,468,566
[45] Date of Patent: Aug. 28, 1984

[54] CORPUSCULAR BEAM CONTROL CIRCUIT ARRANGEMENT

[76] Inventors: Hans-Günther Eichhorn, 18, Fritz-Ritter-Strasse, 6902 Jena-Lobeda, District of Gera; Jürgen Gramss, 49, Pfälzer Strasse, 6900 Jena, District of Gera, both of German Democratic Rep.

[21] Appl. No.: 402,228

[22] Filed: Jul. 29, 1982

[30] Foreign Application Priority Data

Aug. 3, 1981 [DD] German Democratic Rep. ... 232305

[51] Int. Cl.³ .......................................... H01J 37/302
[52] U.S. Cl. .................................................. 250/492.2
[58] Field of Search ..................................... 250/492.2

[56] References Cited

U.S. PATENT DOCUMENTS 4,051,381 9/1977 Trotel ............................... 250/492.2
4,119,857 10/1978 Desperques-Volmier ....... 250/492.2

Primary Examiner—Alfred E. Smith
Assistant Examiner—Jack I. Berman

[57] ABSTRACT

The invention relates to a digital circuit arrangement for control of a corpuscular beam in the procedure of structurizing areas by use of corpuscular irradiation devices operating with linearly extended multi-deflection systems, particularly for use in microlithography, constituted of a plurality of like circuit members for producing columns which contain figure edge points, each member including three triggers for storing edge course control signals indicative of the edge course, the three triggers output signals are combined in antivalence in the respective circuit member to yield an edge point signal. Furthermore, the circuit members are combined in a columnwise member arrangement in which the triggers form shift registers for a positive and negative shift direction. The complete bit pattern columns are generated in a logic circuit arrangement connected to the member arrangement hierarchically setup of antivalence gates from the outputs of which bright-/dark control signals are derived for the multi-deflection system.

6 Claims, 8 Drawing Figures

CORPUSCULAR BEAM CONTROL CIRCUIT ARRANGEMENT

The invention relates to a digital circuit arrangement for control of a corpuscular beam in the course of structurizing areas, particularly for use in corpuscular irradiation devices including linearly extended multi-deflection systems. The procedure of producing micro-electronic structures under use of fast operating pattern generators includes the following steps
- providing topographic layout design for the circuit including the structures being defined by the corner points of figures,
- converting the topographic data into definite control informations for the respective pattern generator;
- structurizing procedure in the pattern generator (exposing procedure), the output being limited by the finite data transfer speed in providing the actual control informations.

Known devices for producing microelectronic circuits employ differently controlled electron beams such as the fixed-spot-type or the variable-shaped-type.

Patterns are produced in these devices either by the raster scan systems or by the vector scan systems.

In the electron beam exposure devices operating to the raster scanning system as disclosed in the Journal of Vacuum Sci, Technology, Vol. 16 No. 6 Nov/Dec. 1979 a plurality of points have to be described which requires to feed in compressed data for the spot (point) control and the line control, respectively.

In the course of the exposure the master pattern is pointwise reconstructed by a real time operation of the hardware, which involves the following disadvantages:
- The amount of compressed data exceeds that of the pattern corner points, the latter being a relevant size for a redundancy free control information for the layout production in microelectronics.
- The data required have to be prepared in order to have compressed data, that is, the data conversion referred to hereinbefore requires considerable computer means.

When the areas to be structurized are treated by the vector scan system as disclosed in J. Vac. Sci. Technology, Vol. 16 No. 6 Nov/Dec. 79 page 1787 ff it is known to compose the area to be structurized of elementary patterns, the position and the size and shape of each individual elementary pattern being controllable.

Elementary patterns are, for example, basic trapezoids which are produced by analog-raster-trapezoid generators. The use of elementary patterns is disadvantageous because of the expenditures required for decomposing complex patterns into elementary patterns in the step of conversion as referred to hereinbefore.

The previous art pattern generators require a repeated throughput of the data conversion and, hence, additional computing time for producing identical structure layout planes in which exposed and unexposed areas have to be reversed.

When a variable shaped electron beam is used for producing elementary patterns as disclosed in Jena Review 23, 5/1978, page 212–218 disadvantages in addition to those mentioned hereinbefore are involved in particular when areas limited by slants have to be produced and when such slants have to be joined to axial parallel geometries, due to a poor flexibility of the variable shaped beam.

Furthermore, an electrostatic deflection system for parallel control of a corpuscular beam is known from the GDR Patent application No. H 01 J/222 294 in which a plurality of electrodes is arranged in line. There are, however, no circuits known which produce the required bright/dark control.

It is an object of the present invention to obviate the above disadvantages.

It is a further object of the present invention to provide a circuit arrangement which ensures an increase of the operation speed for pattern generation in producing microelectronic circuits.

It is still a further object of the present invention to reduce the computer time necessary for the control data preparation, that is, for the conversion of topographic input data into specific control data for the pattern generator.

It is still a further object of the present invention to provide a control circuit for pattern generators in microlithography which permits the structurizing of any desired polygonal areas, such as geometries having axial parallel or 45° inclined edges.

It is still a further object of the present invention to provide a circuit arrangement which permits integration and is constituted of a high percentage of like components.

These and other objects are realised in a digital circuit arrangement for controlling a corpuscular beam for producing structurized areas in microelectronics particularly for use in linearly extended multideflection systems which include a plurality of deflection electrodes for bright/dark modulation for the columnwise processing of the areal geometries to be structurized defined by the corner points of the respective geometries in a nondisplaceable x-, y-raster arrangement.

Preferably, the columns are in parallel to the y-direction. The invention is characterised by the following features:

A circuit member is provided to control a pattern point (picture points).

A number of circuit members is equal to a same number of deflection electrodes, each individual circuit member includes three triggers for storing edge signals defining the run of pattern edge.

Each first trigger contains the edge control signal for a +45° run of edge, each second trigger contains the edge control signal 0°, and each third trigger contains an edge control signal for a −45° run of edge, all three angles are related to the x-coordinate (direction), the columns coinciding with the y-direction.

The simultaneously applied edge control signals and address signals for the y-coordinate and a write-in clock-pulse are connected through logic circuits and by combination yield trigger set and reset pulses, respectively. Each circuit member includes an address-decoder for the y-coordinate.

The clock-pulse inputs of the first and third triggers are connected to a clock-pulse line, connected to perform a raster step in x-direction and the three outputs from said three triggers are connected in antivalence to yield an edge point signal from the respective circuit members.

Furthermore all circuit members are connected in a column array of members in which the first triggers of the circuit member form a shift-register in +y-direction and the third triggers form a shift-register in −y-direction. The serial input of each shift-register is applied a logic zero.

From the edge point signals of the column array of circuit members a black/white control signal is produced for each raster picture point (pixel) of the column by means of a logic circuit connected to the array of circuit members.

An antivalence gate is provided for a number $2^m$ (where m is a natural number) of raster pixels, the output of said antivalence gate delivers a bright/dark control signal. Antivalence gates or circuits are also called "Exclusive Or" and their circuit behaviour is as follows

| AB | C |
|----|---|
| OO | O |
| OL | L |
| LO | L |
| LL | O |

A and B representing input signals, and C the output signal.

The logic combination equation is $(A \wedge \bar{B})-(\bar{A} \wedge B)=C$, where $\wedge$ =and, and $\vee$ =or.

The first inputs of each antivalence gate is connected to the output of an antivalence gate preceding in a column to render a sub-chain, and the second inputs are connected to a corresponding edge point signal output of the array of circuit members.

To obtain a fast signal throughput in the logic circuit subcircuits of the first order are provided, each of which consists of a sub-chain the $2^m$ inputs of which are in antivalence connected to a sub-circuit output signal. The first input of the first antivalence gate of each sub-chain serves as a carry input.

Furthermore respective two subcircuits are combined to yield subcircuits of a higher order in coupling in antivalence subcircuit output signals of low order to yield signals which are fed into the carry inputs of the subcircuits following the logic circuits. The carry inputs of each subcircuit are controlled by the antivalent combination of all edge point signals in the logic circuit preceding these subcircuits.

It is advantageous to apply a bright/dark reversion signal to one input of the logic circuit which completes the produced bright/dark signal for each pixel, the bright/dark reversion signal is fed via additional antivalence gates into the carry input of the subcircuits of the first order.

A buffer system is provided between the outputs of the logic circuits and the multi-deflection electrodes which system is constituted of a plurality of buffers which can be bi-directionally read, corresponding to the +/− x-directions. It is feasible to affect at least one of the corpuscular beams time-parallel, series-parallel or in series by the bright/dark informátions for all image points in one column, stored in the buffer system.

A number of geometries to be produced in the xy-plane is constructed by the subsequent physical joining of bright/dark patterns in line spaced apart by one raster step along the directions of operation, which is refered to hereinafter as the x-direction.

Each line pattern produced in this manner represents the actual cross-section through the number of geometries in a given x-position of the x, y-plane and can be produced in one digital operation.

Only the corner points of the polygonal geometries to be processed are required as control informations. Said polygonal corner points have to be arranged according to size along the operation direction.

In addition to the y-value each point has to be provided with a definite information on the variation (if any) of the edge direction at said point.

This edge control information requires three bit additionally to the coordinate value, thus the course of the two edge lines of a geometry originating from said corner point are encoded.

It does not require any considerable computer means to establish such control informations since the geometries are usually defined by corner point data in microlithography. The linear bit patterns generation to be described is performed in two operational steps.

In the course of operation in x-direction the bit pattern to be produced forms a column in y-direction.

Step 1—formation of a column of the geometry limitation points=edge point column as an actual cross-section through the linear geometry limitations at a position x in the xy-plane.

Step 2—formation of a bit pattern column from the edge point column in the manner that a bit chain of a same logic level is produced between two subsequent edge points. The logic level corresponds to the bright/dark value of the geometry parts to be processed and alternates from bit chain to bit chain since the edge points define the place of the bright-/dark reversion in a given layout.

The time required to perform step 1 is directly dependent on the associated geometry point number at a respective position x. The geometry point number is locally considerably varying which requires a buffer in the system which balances this point density variations with respect to time.

Step 2 is performed by a fast digital circuit without storage elements and depends on a constant time pulse determined by raster steps in operational direction.

Furthermore, the digital arrangement permits a simple bright/dark reversion, that is, the same control data by effect of a control signal can reverse exposed pattern parts into unexposed pattern parts and vice versa.

The inventional digital arrangements for edge point column and bit pattern generation advantageously are performed as integrated digital circuits mostly constituted of repeated like components which reduces the technological expenditures for pattern generator control electronics.

Figure 2:
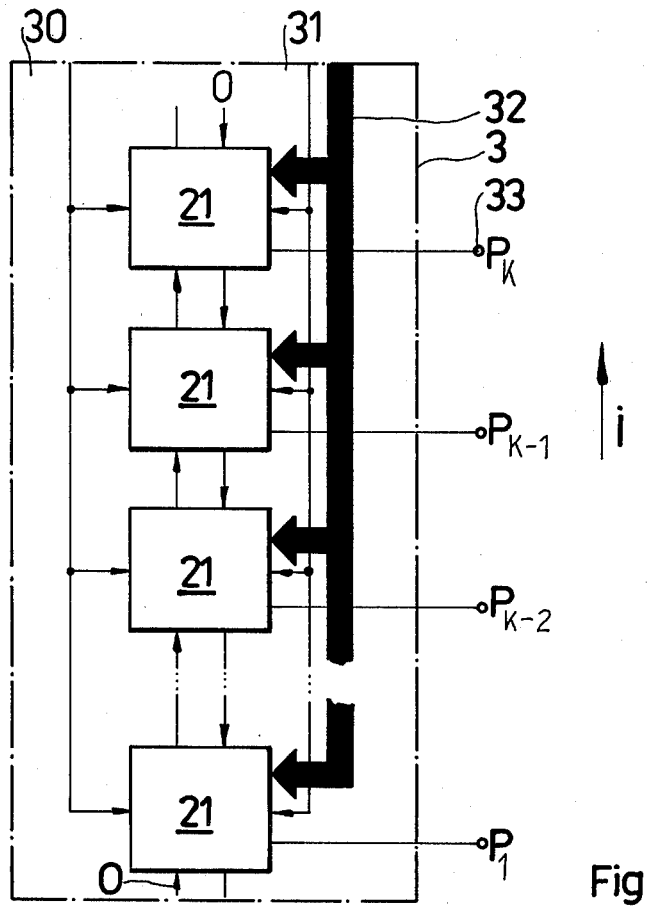
Figure 3:
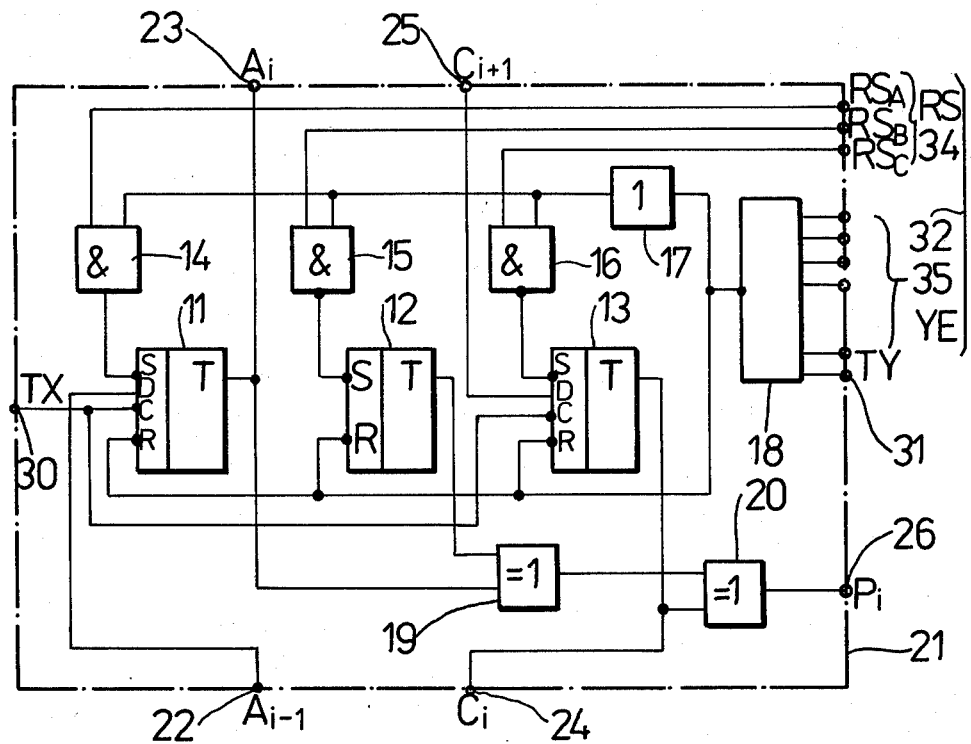
Figure 6A:
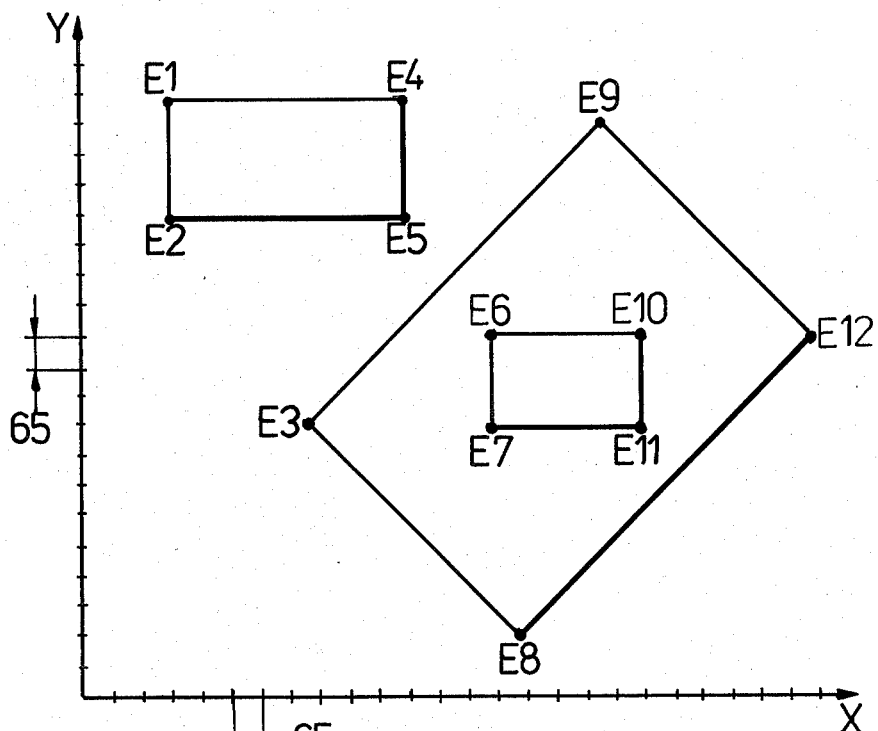
Figure 4A:
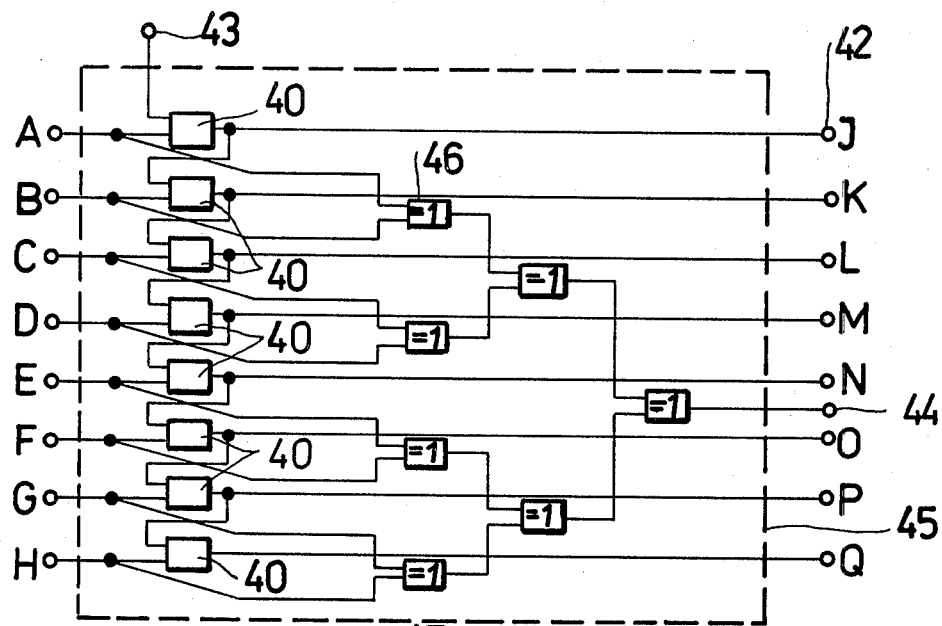
Figure 4B:
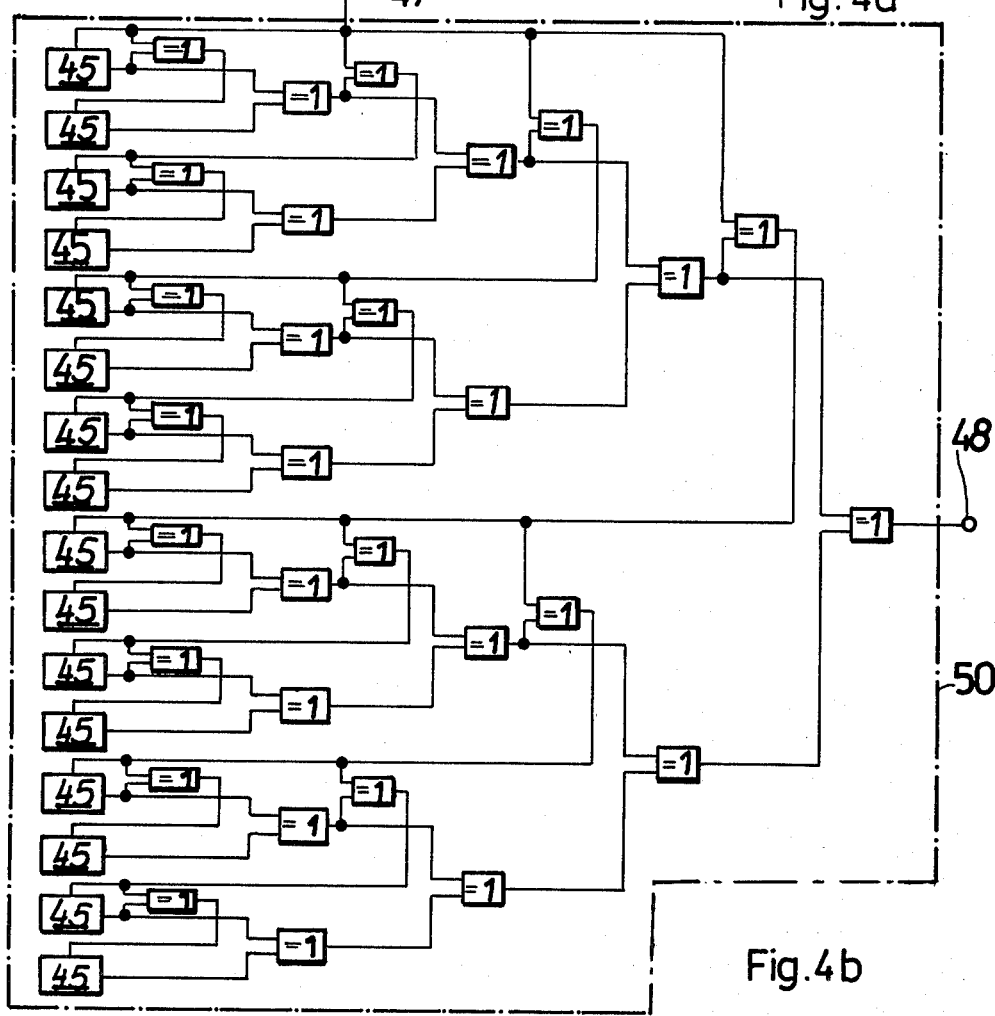
Figure 5:
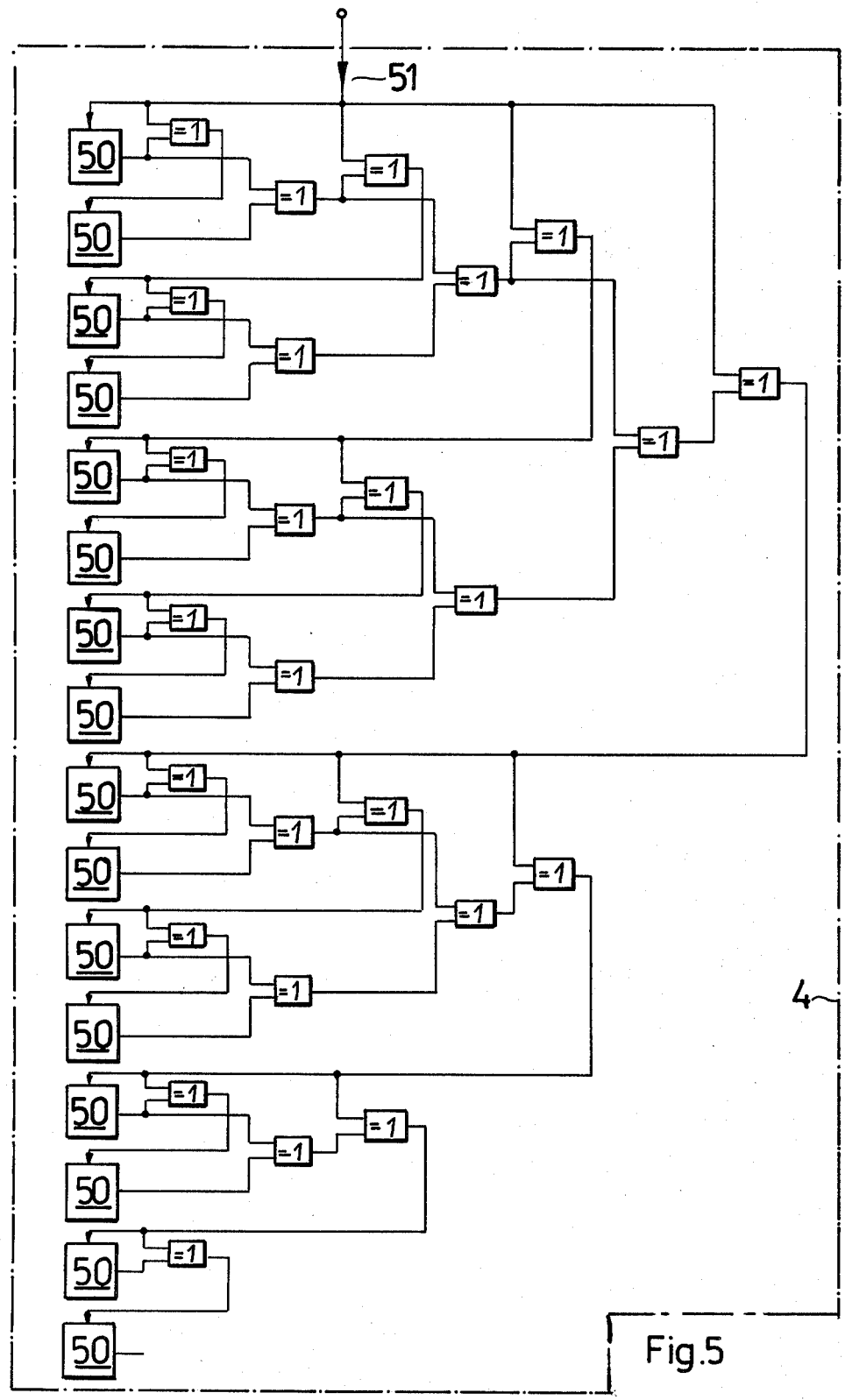
Figure 6B:
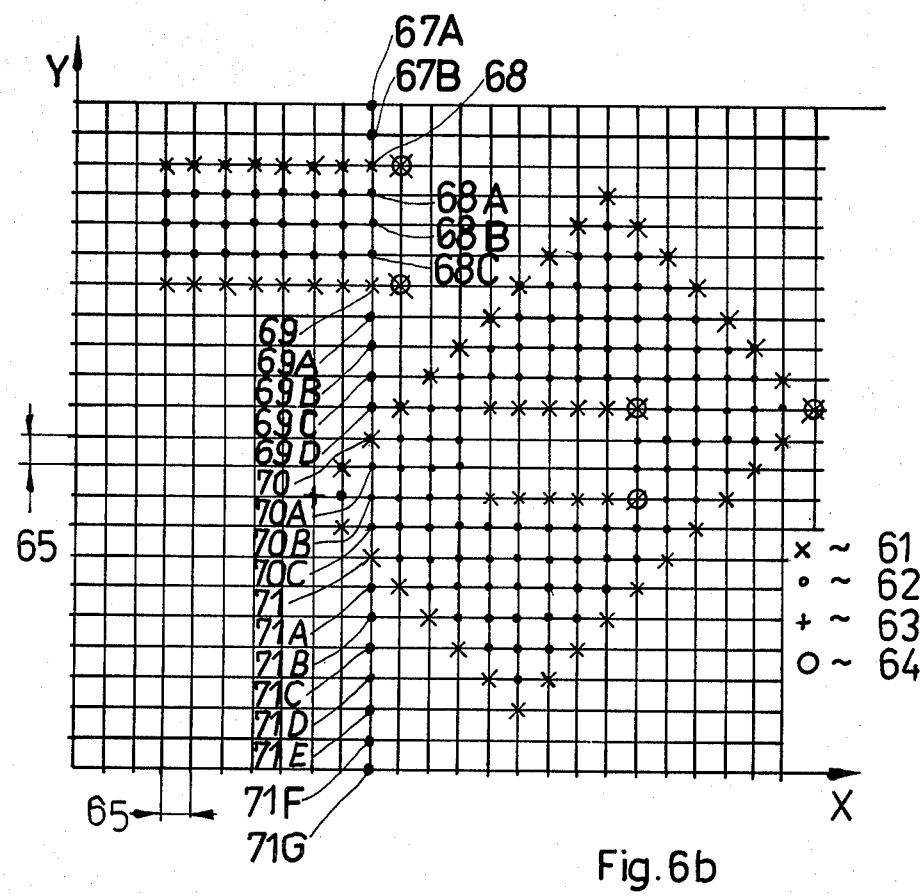

In order that the invention may be more readily understood reference is made to the accompanying drawings which illustrate diagrammatically and by way of example one embodiment thereof and where FIG. 1 is a schematic block scheme of a digital control circuit for parallel driving of a multi-deflection system of a corpuscular beam device, FIG. 2 is a detail of the block scheme according to FIG. 1 for producing edge point column, FIG. 3 a detail of FIG. 2 of a circuit member, FIGS. 4a, 4b and FIG. 5 are arrangement for producing bit pattern columns, FIG. 6a is a graph showing a nominal structure of a pattern section to be produced by a corpuscular beam irradiation device in an x,y-raster, FIG. 6b is a graph showing a schematic pattern produced by the corpuscular beam irradiation device in an x,y-raster.

In FIG. 1 a digital control circuit arrangement for a parallel and/or serial control of a multi-deflection system of a corpuscular beam irradiation device for stripewise operation is constituted of a storage 1 having an input and a connection line 1' to a buffer 2.

The storage 1 is connected via its input to a not shown data input unit for feeding control informations (patterns) as schematically shown in FIG. 6a into the storage 1. The latter contains coordinates of points for said pattern additionally provided with edge control informations for each of said points.

The buffer 2 permits a fast and repeated reading and is connected via a line 2' to a edge point generator 3 having K outputs connected to a logic circuit arrangement 4. The generator 3 serves to produce columnwise the edge points for a pattern as shown in FIGS. 6a, b.

It is assumed that the column coincide with the course of the y-direction in FIGS. 6a/6b and in cooperation with the latter the logic circuit 4 generates a complete pattern of bits of the respective column, where each bit corresponds to a pixel (picture point) and electrode, respectively, of a deflection system 6.

The logic circuit 4 is connected via K' lines to a second buffer 5, which, in turn, is connected via K" lines to the static multi-deflection system 6 of a not shown corpuscular beam irradiation device as used in lithographic pattern production.

A control logic 7 produces the required sequences of clock pulses and is connected via a clockpulse line 5' to the buffer 5. Connection 2", and 2''' for a clockpulse input are established between the control logic 7 and the buffer 2. The generator 3 is connected via a clockpulse line 3' to the control logic 7, furthermore the latter is connected via a line 4' to the logic circuit arrangement 4. In operation the not shown data input unit feeds the corner point information data, for example, for the corner points shown in FIG. 6a $E_1$, $E_2$, $E_3$ etc. and the data of the course of the edges of the geometries defined by said corner point information data into the mass storage 1 via the storage 1 input. A control signal from the logic 7 via the line 1" triggers the data transfer from the storage 1 to the buffer 2 so that the storage 1 data are transferred via the line 1' into the buffer 2.

The control logic 7 gets the informations about the x-coordinate of the corner points via the line 2" from the buffer 2 and derives therefrom the clockpulses for proceeding in x-direction in raster steps 65 indicated in FIGS. 6a and 6b, the clockpulses being fed via the line 3' (30 in FIG. 2) into the generator 3. Via the data line 2' the y-information data are fed into the generator 3 where said informations (32 in FIG. 2) are associated to the corresponding x-information data.

As a result thereof the generator 3 has all required data of the corner points for the pattern to be produced by the deflection system 6 arranged in columns (y-direction) and the generator 3 produces in sequence (in raster steps 65) with each clockpulse from the control logic 7, that is, the generator produces a straight line composed of edge points and straight lines, respectively, between at least two given corner points ($E_2$ and $E_5$, $E_1$ and $E_4$, and, partially simultaneously $E_3$ and $E_9$, and $E_3$ and $E_8$ in FIG. 6a). The straight line or lines which is/are produced in raster steps 65 (FIGS. 6a/b) are either in parallel to the x, y coordinates (for example $E_2$-$E_5$/$E_1$-$E_4$ etc. in FIG. 6a) or include an angle of ±45° with either of the two coordinate directions (for example, $E_3$ ... $E_9$; $E_3$ ... $E_8$). The edge point data are fed via respective K-lines into the logic circuit arrangement 4. The logic circuit arrangement 4 produces a bit chain of equal level between two subsequent edge points in one column (y-direction) in raster steps (65 in FIGS. 6a/b). The bits in said chain correspond to a definite brightness determined by the pattern to be produced, the bits in one chain are either bright or dark. When more than one bit chain occupies one column then subsequent chains are of different state, that is, either dark or bright or vice versa. For example, in FIG. 6b, a first chain is composed of bits 67a and b, a second chain of bits 68, 68a, 68b, 68c, a third chain of bits 69, 69a, 69b, 69c, 69d, a fourth chain of bits 70, 70a, 70b, 70c, and fifth chain of bits 71, 70a–70g. When the first chain bits are bright then the third and fifth chain are, too, the second and fourth chains being dark. The control logic 7 decides on the state of the first bit chain in a column by a respective signal fed into the arrangement via the line 4', that is, it decides whether the first bit chain is bright or dark.

The bit chain data produced in the logic circuit arrangement 4 are fed via the K' lines into the buffer 5. Said data depending on a respective control signal from the control logic 7 fed into the buffer 5 via the line 5' operate the electrodes (not shown) of the deflection system 6 where respective K'-lines are associated to corresponding electrodes of said deflection system 6.

The control signal fed in via line 5' decides on the time which a data of one column (y-direction) is applied to a respective electrode of said deflection system 6, that is, all required data are simultaneously applied to the respective electrodes of the deflection system 6 (time-parallel), or the data are applied to the electrodes in groups, the data contained in one group being fed in simultaneously (or parallel), the individual groups being fed in one after the other (or serially), hence, this operation is serial-parallel,
or the data from the buffer 5 are fed into the electrodes one after the other, (or serially). The buffer 5 permits a bi-directional operation, that is, the data can be read out in ±x-direction.

FIG. 2 shows the layout of the generator 3 which comprises a plurality of members 21 (four shown) the number of which corresponds to the number of pixel to be realised by the deflection system 6 in the course of operation of the not shown corpuscular beam irradiation device. The members 21 are connected by a busline 32 to the buffer 2 via the line 2' and to the control logic 7 via the line 3'. The members 21 form a shift register being connected to a clockpulse line 30 (3' of FIG. 1) for the x-coordinate signals and 31 for the y-coordinate signals.

Furthermore, the members 21 are subsequently connected via shift lines A and C at the start position of which a zero signal 0 is applied. The shift register 21 is further provided with outputs $P_1, \ldots, P_{K-2}, P_{K-1}$, and $P_K$. FIG. 3 shows one shift register member 21 constituted of three triggers 11, 12, and 13, a decoder 18, three gates 14, 15, 16, and a negator 17, and two antivalence circuits 19 and 20. The shift register 21 line A realises a shift direction in (+) y-direction and the shift register 21 line C a shift direction in (−) y-direction.

The input TX is connected to the clockpulse inputs of the triggers 11 and 13, the inputs TY (31) and YE (35) are applied to a decoder 18 the output of which is connected to the reset inputs of the triggers 11, 12, 13, and simultaneously to the gates 14, 15, 16 via the negator 17. The $RS_A$ input is connected to the second input of the gate 14 the output of which is connected to the set input of the trigger 11. The input $RS_B$ is connected to the second input of the gate 15 the output of which is connected to the set input of the trigger 12. The input $RS_C$ is connected to the second input of the gate 16 the output of which is connected to the set input 13.

The outputs of the trigger 11 and of the trigger 12 are connected to the inputs of the antivalence circuit 19 the output of which is connected to one input of the antivalence circuit 20, the second input of which is connected to the output of the trigger 13 and simultaneously to the output 24.

The output of the antivalence circuit 20 is connected via the output 26 to one input of the logic circuit arrangement 4. The input 22 of the shift register line A ($A_{i-1}$) is connected to the data input of the trigger 11.

The output of the trigger 11 is connected to the output 23 ($A_i$) (connection to the neighbouring shift register component 21). The input 25 ($C_{i+1}$) from the neighbouring shift register 21 component is connected to the data output of the trigger 13. According to the number of pixels realised by the deflection system 6 the number of shift register components 21 is selected.

The triggers 11, 12 and 13 store the edge control signals in completion of the corner point informations. Each of the edge control signals $RS_A$, $RS_B$ and $RS_C$ is encoded by three bits and represents a definite directional course of the respective edge of a geometrical pattern to be produced by the corpuscular beam irradiation device. An L at the output of the trigger 11 defines an edge including an angle of $+45°$ with the coordinate system, for example, $E_3$-$E_9$ in FIG. 6a. An L at the output of trigger 12 defines an edge which is parallel to the x-axis (FIGS. 6a/b) that is, 0°.

An L at the output of the trigger 13 defines an edge including an angle of $-45°$ with the x-coordinate, for example, edge $E_3$-$E_8$ in FIG. 6a.

Consequently, $RS_A \hat{=} +45°$, $RS_B \hat{=} 0°$, and $RS_C \hat{=} -45°$. A code 000 defines a direction to the left and a vertical direction (for example $E_4$ and $E_5$ in FIG. 6a) or two directions to the left (for example $E_{12}$ in FIG. 6a) and any signals previously stored in the addressed circuit member 21, thus producing a logic 0 signal at the output 26, that means, the pattern is "finished" at said point. Further encodings are L00; 0L0; 00L; L0L; LL0; 0LL for corner points having one and two, respectively, directions to the right.

The clockpulse from the control logic 7 applied to the components 21 via the input TX (30) and produced for each raster step 65 (FIGS. 6a, 6b) produces at the respective position the real edge points of a geometrical figure (for example as shown in FIG. 6b) derived from the proceding column of edge points.

The clockpulse TX (30) operates as a shift pulse in the shift register arrangement of components 21 which register shifts the information (signals) along the positive direction ($+y$) via the terminals 22 (entry) and 23 (exit), in parallel thereto the triggers 13 of the components 21 are a shift register in the opposite shift direction ($-y$) via the terminals 25 (entry) and 24 (exit).

The state of the trigger 12 is non-affected by the clock-pulse TX (30), which maintains its state as set by the preceding x-position.

When in buffer 2 new corner point informations 32 for completion of a real x-position are stored, the informations 32 comprising an address signal for the y-coordinate 35 and the associated edge control signals (34) RS are fed into the triggers 11, 12, 13 of the members 21 by the clock-pulses TY (31) from the control logic 7.

The number of clockpulses (31) TY required corresponds to the number of corner points to be fed into one column. To this end the decoder 18 produces a pulse, provided a clockpulse TY (31) is applied, which effects a pre-resetting of the triggers 11, 12, 13 via the respective reset connections R. Said pulse further effects a setting of the triggers 11, 12, 13 through the delay obtained by the gates 14, 15, 16 series connected to the set inputs S of the triggers 11, 12, 13 and the delay of a negator 17. The set informations are the three bits $RS_A$, $RS_B$, and $RS_C$ of the encoded edge point.

Furthermore the trigger 11, 12, 13 outputs are connected via the antivalence circuits 19 and 20 to produce the output signal 26 which is the edge point signal for an edge point to be produced. The amount of K output signals 26 forms an edge point column 33.

In FIGS. 4a, 4b and 5 the logic circuit arrangement 4 of FIG. 1 is shown in more detail.

In FIG. 4a a simple embodiment of the logic circuit arrangement 4 is constituted of K antivalence gates 40 which are interconnected.

The antivalence operation is formed out of the output signal from a preceding gate and the given edge point signal 41. The outputs 42 represent the bright/dark control information for the respective image point realised by the deflection system 6.

The FIGS. 4a, 4b and 5 represent schematical layouts for a number of column points K=2048.

The operation time $\tau_G$ of one antivalence gate would yield an entire operation time $\tau = 2048\tau_G$ for the mentioned number of column points until a complete bit pattern column is generated out of the given edge point columns.

This time is considerably reduced by a fast carry formation. Such a fast generation of bit pattern columns is explained in connection with FIGS. 4a, b and 5, a respective circuit arrangement 4 is constituted of repeatedly arranged partial circuits 50 forming chains, which are interconnected via antivalence gates 50'.

Each of the partial circuits 50 is constituted of sixteen circuits 45 of FIG. 4b which are interconnected by antivalence circuits 45' and are provided with one output 48 which serves to perform a fast antivalence integration. Furthermore, each partial circuit 50 includes a carry input 47 for transfer of the integrated antivalence output signals 48 which are present in the chain arrangement from the start up to the member 45 under operation.

Said member 45 is shown in more detail in FIG. 4a and is constituted of a sub-chain of eight series connected antivalence gates 40.

The inputs A-H of each gate 40 are controlled by the edge point signal 41 and by the outputs of the antivalence gates preceding in the chain.

The outputs 42 J-Q of the series connected antivalence gates 40 produce the respective eight output signals of the bit pattern column.

There is no output at the end of the sub-chain, that is, at the output Q of the antivalence gate. In order to obtain a fast transfer the eight input signals (A-H) 41 are groupwise combined according to FIG. 4 in seven separate antivalence gates 46 and these form the output signal 44.

Thus as shown in FIGS. 4 and 5 a cascade of $16 \times 16$ 8 bit partial circuits is obtained the maximum switching time of which is $\tau_{max} = 26\tau_G$.

Independent of the embodiment of the arrangement 4 the bright/dark level for all pixels of a bit pattern column can be negated by applying a 0 and L level, respectively, to the carry input 43 of the topmost sub-chain 45, which is the bright/dark input value 51 in the embodiment.

The bright/dark level at the input 51 is the initial bright/dark level for each bit pattern column.

In FIG. 6a a nominal geometrical pattern to be processed in the arrangement as described in connection with FIG. 1 is shown comprising an x-coordinate and a y-coordinate, where the y-coordinate is the direction of a column as referred to hereinbefore, and the x-direction is the direction of operation of processing the columns.

The corner points $E_1$ to $E_{12}$ correspond to the corner points of a geometrical pattern to be produced by the deflection system 6 and represented in FIG. 6b.

The numbers of the corner points also indicate the sequence of the control data in the buffer 2 which have to be delivered for processing into the arrangement of FIG. 1.

The steps of operation are designated by 65 and are raster steps.

In FIG. 6b a raster is shown again comprising an x-coordinate and an y-coordinate. The complete number of corner points and edge points ae represented.

The edge point columns constituted of the edge points 61 are produced by the arrangement 3 of FIG. 1 and the complete number of resulting bit pattern columns of pixels 62 (bright scanned) produced by the logic circuit arrangement 4 of FIG. 1.

The pixel 63 in the present example is not excited due to the antivalence function of the gates 19 and 20 (FIG. 2).

Corner points of the edge control (RS=000) 64 are produced by the means of the clockpulse (TY) 31 and effect that the respective edge points 61 produced by the clockpulse (TX) 30 are erased.

FIGS. 6a and 6b are also described in connection with FIG. 1.

We claim:

1. A digital circuit arrangement for control of a corpuscular beam in the course of producing structurized areas by use of corpuscular irradiation devices, particularly operating with linearly extended multi-deflection systems including a plurality of deflection electrodes for bright/dark modulation for processing of said geometrical areas in columns, comprising
an x, y-raster, figure points defining said geometrical areas in said x,y-raster,
said figure points being constituted of edge points and corner points,
a generating means comprised of a plurality of electronic members,
said electronic members being for producing columns,
said columns containing said edge points,
said plurality of electronic members corresponding in number to said number of deflection electrodes,
said electronic members including a first,
a second and a third trigger each,
said first, second and third trigger storing edge control signals defining the direction of arrangement of said edge points in said x,y raster,
said first trigger defining an angle of +45° between said direction and the x-direction of said x, y-raster,
said second trigger defining an angle of 0° between said direction and said x-direction,
said third trigger defining an angle of −45° between
said direction and the (negative) x-direction,
each of said electronic members further comprising
a decoder,
a first, a second, and a third gate,
a first and a second antivalence circuit,
said edge control signals and an y-coordinate address signal from said decoder and a write-in clockpulse from said decoder being simultaneously connected to the set and reset inputs of each of said triggers via a respective gate of said first, second and third gate in each of said electronic components,
the clockpulse inputs of said first and said third trigger of each of said electronic members being connected via a clockpulse bus line to perform a raster-step in x-direction,
the outputs of said first and second trigger being connected to the inputs of a first antivalence gate,
the output of said first antivalence gate and the output of said third trigger being connected to the inputs of a second antivalence gate, the output of said second antivalence gate being the edge point signal output of each of said electronic components,
said electronic members being further columnwise connected to form a first and a second shift register,
said first shift register being constituted in that the outputs of each of said first triggers of said electronic members being connected to the data input of said first triggers in adjacent of said electronic members,
said second shift register being constituted in that the data input of said third triggers in said electronic members being connected to the output of said third trigger in adjacent of said electronic members,
the inputs of the respective first electronic members in the column of electronic members being on logic "zero",
a logic circuit arrangement being connected to said generating means for producing of complete bit pattern columns out of the edge point signals from the columnwise arrangement of electronic members said logic circuit arrangement being for producing a bright/dark control signal for each raster pixel wherein first antivalence members being provided, one of said antivalence members being provided for a number $2^m$ (where m is a natural number) of raster pixels, the output of said antivalence members producing a bright/dark control signal, the first inputs of said antivalence members being connected to the respective outputs of an adjacent preceding antivalence member, thus forming sub-chains, the second inputs of said antivalence members being connected to the respective edge point signal outputs of said electronic members,
said logic circuit arrangement including subcircuits constituted of one sub-chain each, the $2^m$ output signals of which being combined in antivalence to a a subcircuit output signal, the first input of the first antivalence gate in each sub-chain being a carry input,
pairs of adjacent of said subcircuits being combined to form a higher order subcircuit by connecting in pairs subcircuit output signals to carry inputs of subsequent subcircuits, the carry inputs of each of said subcircuits being controlled by the antivalence combination of all edge point signals operative before said subcircuits.

2. An arrangement as claimed in claim 1, wherein said columns are in parallel to the y-direction of said x, y-raster.

3. An arrangement as claimed in claim 1, wherein one input of said logic circuit arrangements gets a bright-/dark reversion signal, which completes the produced bright/dark control signal for each pixel in feeding said signal via additional antivalence gates into each carry input of said subcircuits.

4. An arrangement as claimed in claim 1, wherein a buffer system is inserted between the outputs of said logic circuit arrangement and said multi-deflection system, said buffer being constituted of a plurality of partial buffers being bidirectionally readable.

5. An arrangement as claimed in claim 4, wherein the bright/dark signals for all pixels of one column stored in said buffer affect at least one corpuscular beam time-parallel serial-parallel or serially.

6. An arrangement as claimed in claim 3, wherein an entire circuit arrangement for producing a column of bright/dark control signals derived from given figure points including edge point control signals is embodied by highly integrated circuits and a cascade of highly integrated like components, respectively.

* * * * *